(12) United States Patent
Miller et al.

(10) Patent No.: US 7,903,405 B1
(45) Date of Patent: Mar. 8, 2011

(54) ELECTRONIC DEVICE ENCLOSURES HAVING IMPROVED VENTILATION TO DISSIPATE HEAT

(75) Inventors: Arlyn Earl Miller, Leander, TX (US); Gary Law, Georgetown, TX (US); Kent A. Burr, Round Rock, TX (US); Paul Noble-Campbell, Austin, TX (US); Vincent Lam, Austin, TX (US); Laura Avery, Austin, TX (US); Garrett Lewis, Austin, TX (US); Kevin Sloan, Austin, TX (US); Mark William Foohey, Austin, TX (US)

(73) Assignee: Fisher-Rosemount Systems, Inc., Austin, TX (US)

( * ) Notice: Subject to any disclaimer, the term of this patent is extended or adjusted under 35 U.S.C. 154(b) by 0 days.

(21) Appl. No.: 12/562,546

(22) Filed: Sep. 18, 2009

(51) Int. Cl.
*H05K 7/20* (2006.01)
(52) U.S. Cl. .......... 361/690; 361/689; 361/692; 454/184
(58) Field of Classification Search .......... None
See application file for complete search history.

(56) References Cited

U.S. PATENT DOCUMENTS

| | | | | |
|---|---|---|---|---|
| 4,840,225 A | * | 6/1989 | Foley et al. | 165/104.33 |
| 5,914,858 A | * | 6/1999 | McKeen et al. | 361/695 |
| 5,995,368 A | * | 11/1999 | Lee et al. | 361/695 |
| 6,201,705 B1 | * | 3/2001 | Nygren et al. | 361/753 |
| 7,167,641 B2 | * | 1/2007 | Tam et al. | 392/405 |
| 7,365,974 B2 | * | 4/2008 | Hartung | 361/695 |
| 7,394,654 B2 | * | 7/2008 | Zieman et al. | 361/695 |

* cited by examiner

Primary Examiner — Boris L Chervinsky
(74) Attorney, Agent, or Firm — Hanley, Flight & Zimmerman, LLC

(57) ABSTRACT

Electronic device enclosures providing improved heat dissipation are described herein. An example enclosure for holding an electronic circuit board includes a housing having a first portion coupled to a second portion to form a cavity to hold the electronic circuit board. Each of the first and second portions comprises openings to direct convention airflow across opposing faces of the electronic circuit board at the same time. A baffle is coupled to the housing to substantially visually obscure the openings and to define a gap between the housing and the baffle to direct the convection airflow across the opposing faces of the electronic circuit board.

20 Claims, 14 Drawing Sheets

ELECTRONIC DEVICE ENCLOSURES HAVING IMPROVED VENTILATION TO DISSIPATE HEAT

FIELD OF THE DISCLOSURE

This disclosure relates generally to enclosures and, more particularly, to electronic device enclosures having improved ventilation to dissipate heat.

BACKGROUND

Process control systems are widely used, for example, in factories and/or plants in which products are manufactured or processes are controlled (e.g., chemical manufacturing, power plant control, etc.). Most modern process control systems include smart field devices and other process control components that are communicatively coupled to each other and/or to one or more controllers, Ethernet switches, and/or other electronic devices.

Electronic devices include electronic components or circuitry (e.g., an electronic circuit board) disposed within a housing or enclosure. During operation, the electronic components can generate significant amounts of heat, which may cause the electronic components to overheat and become damaged or otherwise impaired. To prevent overheating of the electronic devices, the heat generated by electronic components should be properly dissipated via the enclosure. Proper heat dissipation can improve reliability and prevent premature damage and failure of the electronic devices and/or components.

SUMMARY

In one example, an enclosure for holding an electronic circuit board includes a body having a first face, a second face opposite the first face, and an exterior peripheral surface separating the first and second faces. The electronic circuit board is to be disposed between the first and second faces so that a first side of the electronic circuit board faces the first face and the second side of the electronic circuit board faces the second face. A first portion of the exterior peripheral surface includes at least one opening for at least one electrical connector to electrically couple the electronic circuit board to another electronic device. A second portion of the exterior peripheral surface includes a first air vent to be oriented in a downwardly facing direction and a third portion of the exterior peripheral surface includes a second air vent opposite the first air vent and which is to be oriented in an upwardly facing direction. A baffle is coupled to the body adjacent at least the second and third portions of the exterior peripheral surface such that the baffle is configured to direct airflow into the first air vent and out the second air vent. Also, the baffle is to be coupled adjacent the second and third portions of the exterior peripheral surface to at least partially visually cover the air vents.

In another example, an enclosure for holding an electronic circuit board includes a housing having a first portion coupled to a second portion to form a cavity to hold the electronic circuit board. Each of the first and second portions comprises openings to direct convection airflow across opposing faces of the electronic circuit board at the same time. A baffle is coupled to the housing to substantially visually obscure the openings and to define a gap between the housing and the baffle to direct the convection airflow across the opposing faces of the electronic circuit board.

In yet another example, an enclosure for holding an electronic circuit board includes a housing having a cavity to hold the electronic circuit board. The housing having first openings on a first side of the housing to be oriented in a downwardly facing direction and second openings on a second side of the housing to be oriented in an upwardly facing direction. A baffle is coupled to the housing and spaced from the openings to visually obscure the openings and to direct airflow into the first openings, adjacent opposing faces of the electronic circuit board at the same time, and out the second openings.

DETAILED DESCRIPTION

The example enclosures described herein may hold an electronic circuit board of an electronic device (e.g., an Ethernet switch). In particular, the example enclosures described herein provide improved ventilation to dissipate heat generated by an electronic device more efficiently. Ventilation is provided by the example enclosures via a natural convection and passive cooling configuration that does not require the use of fans, liquid cooling systems, heat sinks, etc. In this manner, the example enclosures described herein can be used to properly dissipate heat to improve the overall reliability and prevent premature damage and failure of electronic device components (e.g., an electronic circuit board) mounted within or held by the enclosures.

In one example, an enclosure described herein includes a housing having a cavity to hold one or more electronic circuit boards. The housing includes air vents or openings to direct convection or passive airflow across opposing faces of the electronic circuit board(s) at the same time. The enclosure also includes a baffle coupled to the housing to visually obscure the openings and to define a gap between the housing and the baffle to direct or channel the convection airflow across the opposing faces of the electronic circuit board. Also, the air vents are recessed relative to outer surfaces of the housing and the baffle at least partially covers the air vents to help prevent or substantially reduce the ingress of debris, dirt, air-borne particles, and/or other contaminates or objects to an interior surface of the enclosure via the air vents or openings.

Additionally, the example enclosure is shaped and/or sized to provide improved passive airflow (e.g., increased airflow velocity) as air flows between the air vents or openings (e.g., to provide a chimney effect or a stack effect). For example, the housing may be configured such that a height of the housing is larger than a width of the housing. The air vents are located adjacent the substantially vertical ends of the enclosure (e.g., adjacent top and bottom ends of an enclosure) to provide cross-ventilation across all surfaces of the electronic components disposed within the housing at the same time. In some examples, the housing may include a curved surface or profile to facilitate the channeling of air flow between the air vents.

In contrast, some known electronic devices may include heat sinks, fans, and/or liquid cooling systems to dissipate heat from one or more electronic devices. However, heat sinks, liquid cooling systems, fans, etc., significantly increase manufacturing costs. Additionally, such heat dissipation systems typically increase the overall physical or dimensional envelope or footprint of the enclosure. Further, in some instances, space may be limited. Thus, natural convection ventilation may be the only means available to dissipate heat from an electronic circuit board.

Figure 1A:
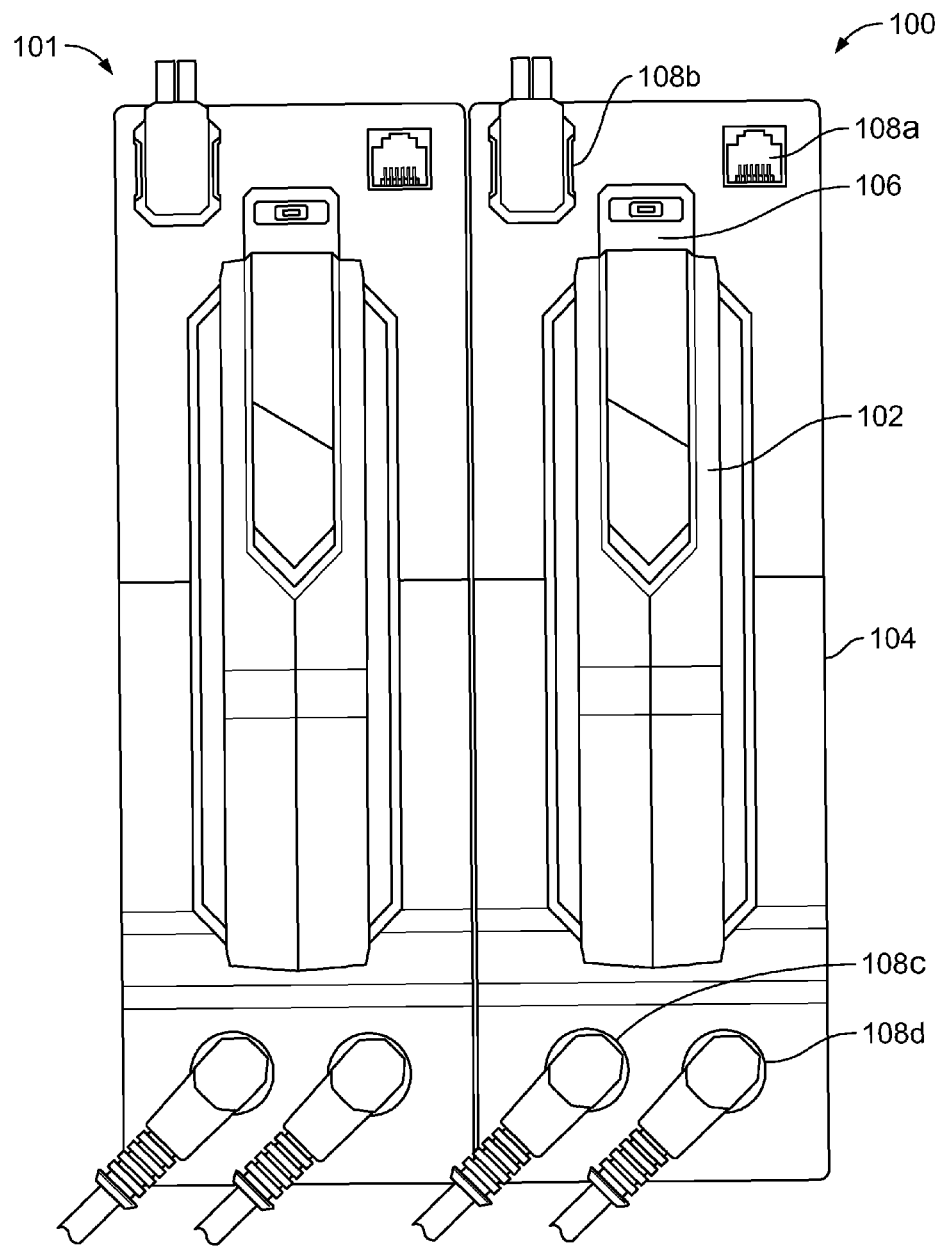
FIGS. 1A and 1B illustrate an electronic module implemented with an example enclosure described herein.
Figure 1B:
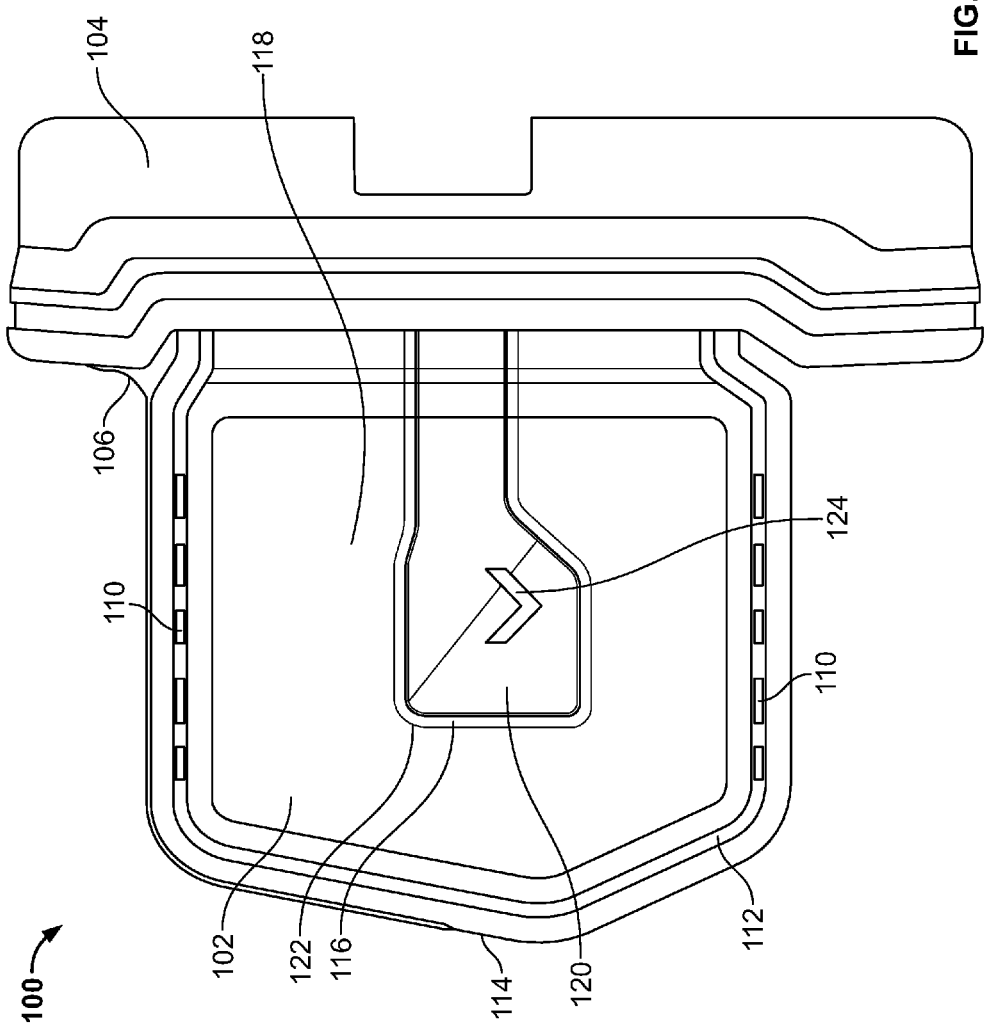

FIGS. 1A and 1B illustrate an example electronic module 100 described herein. Referring to FIGS. 1A and 1B, the example electronic module 100 described herein can be used, for example, with a process control system. For example, the electronic module 100 can be used to implement a network device such as, for example, an Ethernet switch. The example electronic module 100 may be communicatively coupled to a second electronic module 101, a controller, and/or or any other device. In this example, the electronic module 100 includes an enclosure 102 that removably couples to a base 104 via a latching mechanism 106. The base 104 includes ports 108a-d such as, for example, a power port, a data transmission port, an uplink port, and/or any other suitable ports to receive power lines and/or transmission lines to communicate data to a desired location and/or device. The base 104 may be mounted within and/or to, for example, a cabinet, a rack, a field device, and/or any other suitable mounting surface(s).

The enclosure 102 provides an improved passive cooling or natural convection ventilation to provide more efficient dissipation of heat. In particular, as shown in FIG. 1B, the enclosure 102 may include air passages or vents 110 along a peripheral external surface 112 of the enclosure 102 to provide ventilation between the air passages or vents 110. The enclosure 102 also includes a baffle or spine 114 to at least partially visually cover the air passages or vents 110. Alternatively, the enclosure 102 may include an air passage or vent 116 along a body portion 118 of the enclosure 102. A second baffle 120 may be coupled to the enclosure 102 to at least partially visually cover the air passage or vent 116. The second baffle 120 may provide indicia 122 associated with a characteristic of the electronic module 100. Although not shown, the air passage or vent 116 may be projected inwardly (e.g.,) recessed relative to the body portion 118 via a beveled edge 124 to provide a gap between the air passage or vent 116 and the second baffle 120 to enable air flow through the air passage or vent 116. The enclosure 102 may be configured to include the air passages or vents 110, the air passage or vent 116 and/or other air passages disposed along other portions of the external peripheral edge 112 and/or the body 102.

FIGS. 2A-2D illustrate another example enclosure 200 described herein that may be used to implement the example electronic module 100 of FIGS. 1A and 1B. Referring to FIGS. 2A-2D, the example enclosure 200 includes a housing or body 202 having a cavity 204 to hold, for example, one or more electronic circuit boards 206. The housing 202 includes a first or right face 208 and a second or left face 210 opposite the first face 208. The housing 202 also includes an exterior peripheral surface 212 separating the first and second faces 208 and 210.

In this example, a first electronic circuit board 214a is electrically coupled to (e.g., via a connector) and disposed adjacent a second electronic circuit board 214b to provide a smaller dimensional footprint. In other examples, the first electronic circuit board 214a may not be electrically coupled to the electronic second circuit board 214b and may function independently from the second electronic circuit board 214b. In yet other examples, more than two electronic circuit boards may be disposed within the housing 202.

The first and second electronic circuit boards 214a and 214b are disposed within the housing 202 such that respective first sides 216a and 216b of the first and second electronic circuit boards 214a and 214b face the first face 208 of the housing 202 and respective second sides 218a and 218b of the first and second circuit boards 214a and 214b face the second face 210 of the housing 202. The first and second electronic circuit boards 214a and 214b are disposed within the housing 202 such that a space 220 is defined between the first side 216b of the second electronic circuit board 214b and the second side 218a of the first electronic circuit board 214a. Additionally, in this example, the first and second electronic circuit boards 214a and 214b are substantially vertically orientated when the electronic module 100 is in use.

In this example, the enclosure 200 includes racks, brackets or holders 222 and 224a-b to retain the electronic circuit boards 214a-b within the housing 202. In other examples, the housing 202 may include pins to help retain the electronic circuit board(s) 206 within the housing 202. A light bar 226 may be coupled to the electronic circuit board(s) 206 to provide indicator or status lights 228 (e.g., LED lights) to display the operational status of the electronic module 100 (FIGS. 1A and 1B). For example, one or more of the status lights 228 may be illuminated to indicate, for example, a power status, a speed status, a connection status, and/or any other operational status of the electronic module 100 and/or a network system to which the electronic module 100 is operatively coupled.

Figure 2A:
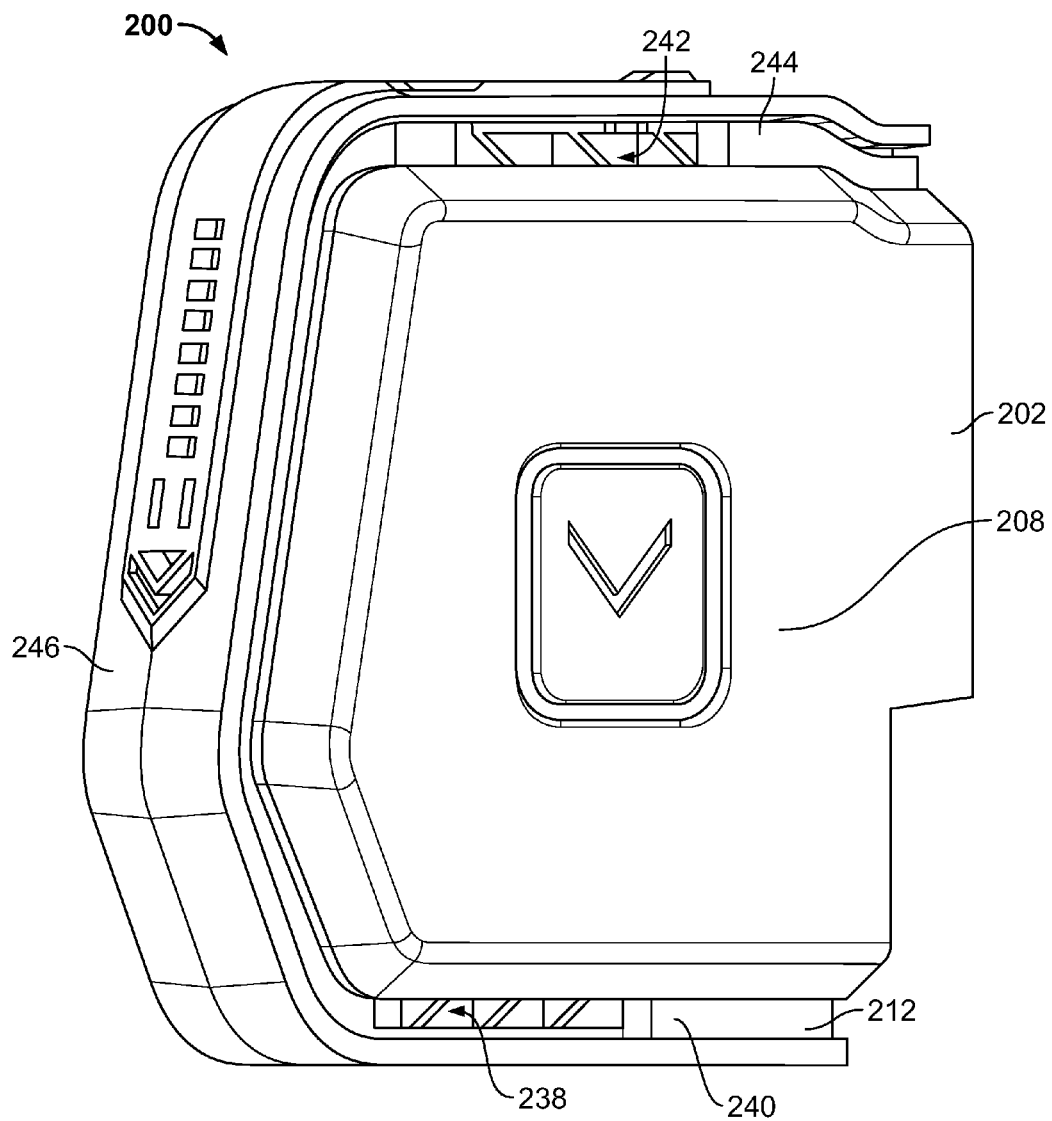
FIGS. 2A-2D illustrate different views of the example enclosure illustrated in FIGS. 1A and 1B.
Figure 2B:
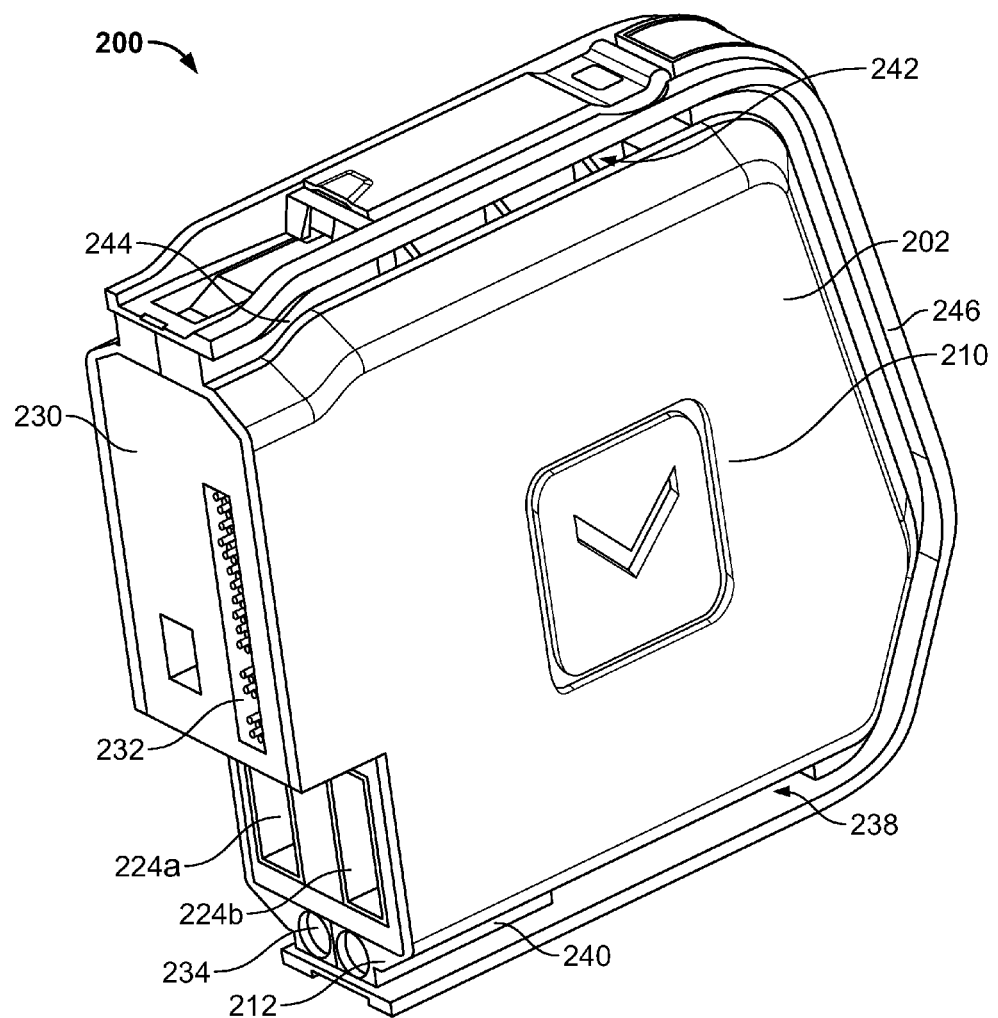
Figure 2C:
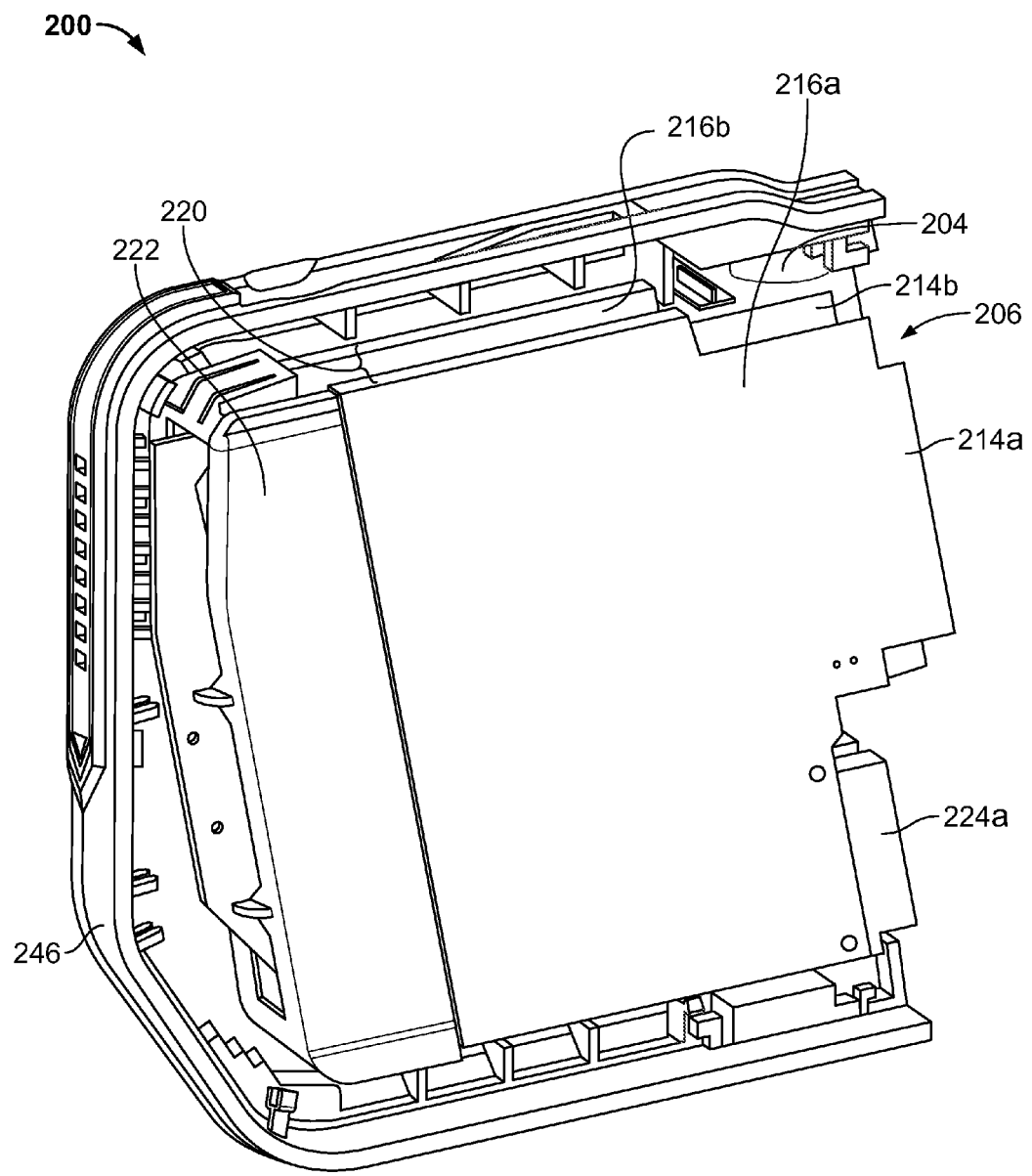

As shown in FIG. 2B, the enclosure 200 includes a rear portion 230. The rear portion 230 includes at least one opening 232 and/or other connectors 234 to electrically couple the electronic circuit boards 214a-b to, for example, the base 104 (FIGS. 1A and 1B) and/or other electronic devices. In yet other examples, the rear portion 230 may include communication ports, power supply ports, or any other suitable ports to receive, for example, data transmission lines or cables so that the base 104 is not required.

As noted above, the enclosure 200 provides an improved passive cooling or natural convection ventilation to provide more efficient dissipation of heat generated by the electronic circuit boards 214a-b disposed within the housing 202. In particular, the housing 202 includes a first air vent 238 along a first portion 240 of the exterior peripheral surface 212 of the housing 202 and a second air vent 242 along a second portion 244 of the exterior peripheral surface 212 of the housing 202 to direct convection airflow across opposing faces (e.g., the first sides 216a-b and second sides 218a-b) of the electronic circuit boards 214a-b. Thus, the airflow is directed between the space 220 formed between the electronic circuit boards 214a-b and along respective interior portions or surfaces (e.g., of the opposing faces 208 and 210) of the housing 202 at the same time.

In this example, the first air vent 238 is to be oriented in a downwardly facing direction and the second vent 242 is to be oriented in an upwardly facing direction and opposite the first vent 238. As shown, the air vents 238 and 242 are adjacent the first and second faces 208 and 210 of the housing 202. Additionally, the housing 202 is shaped and/or sized (e.g., has a greater height relative to its width) to provide improved air flow (e.g., increased airflow velocity) as the air flows between the first and second air vents 238 and 242.

The enclosure 200 also includes a baffle or spine 246 coupled (e.g., mechanically coupled) to the housing 202 to be a structural member of the enclosure 200. In general, the baffle 246 is coupled to the housing 202 adjacent at least the first portion 240 of the exterior peripheral surface 212 and the second portion 244 of the exterior peripheral surface 212 adjacent the respective first and second air vents 238 and 242. When coupled to the housing 202, the baffle 246 at least partially visually obscures or covers the first and second air vents 238 and 242. The baffle 246 is coupled to the housing 202 such that the baffle 246 directs the convection airflow across the opposing faces of the electronic circuit board 206. In other words, the baffle 246 is configured to direct airflow into the first air vent 238, across the surfaces 216a-b, 218a-b of the electronic circuit boards 214a-b, and out of the second air vent 242.

In other examples, a third vent may be provided along a third portion (e.g., a front portion) of the exterior peripheral surface 212 of the housing 202. The baffle may included openings (e.g., downwardly angled openings) to at least partially cover the third vent. In other examples, at least one of the first or second faces 208 and 210 may include another air vent to direct airflow adjacent a respective one of the sides (e.g., 216a-b and 218a-b) of the electronic circuit boards 214a-b. Additionally, a second baffle (not shown) may be coupled to the first or second faces 208 and 210 to at least partially cover the other air vent (e.g., similar to the air vent 116 and the baffle 120 of FIG. 1B).

Figure 2D:
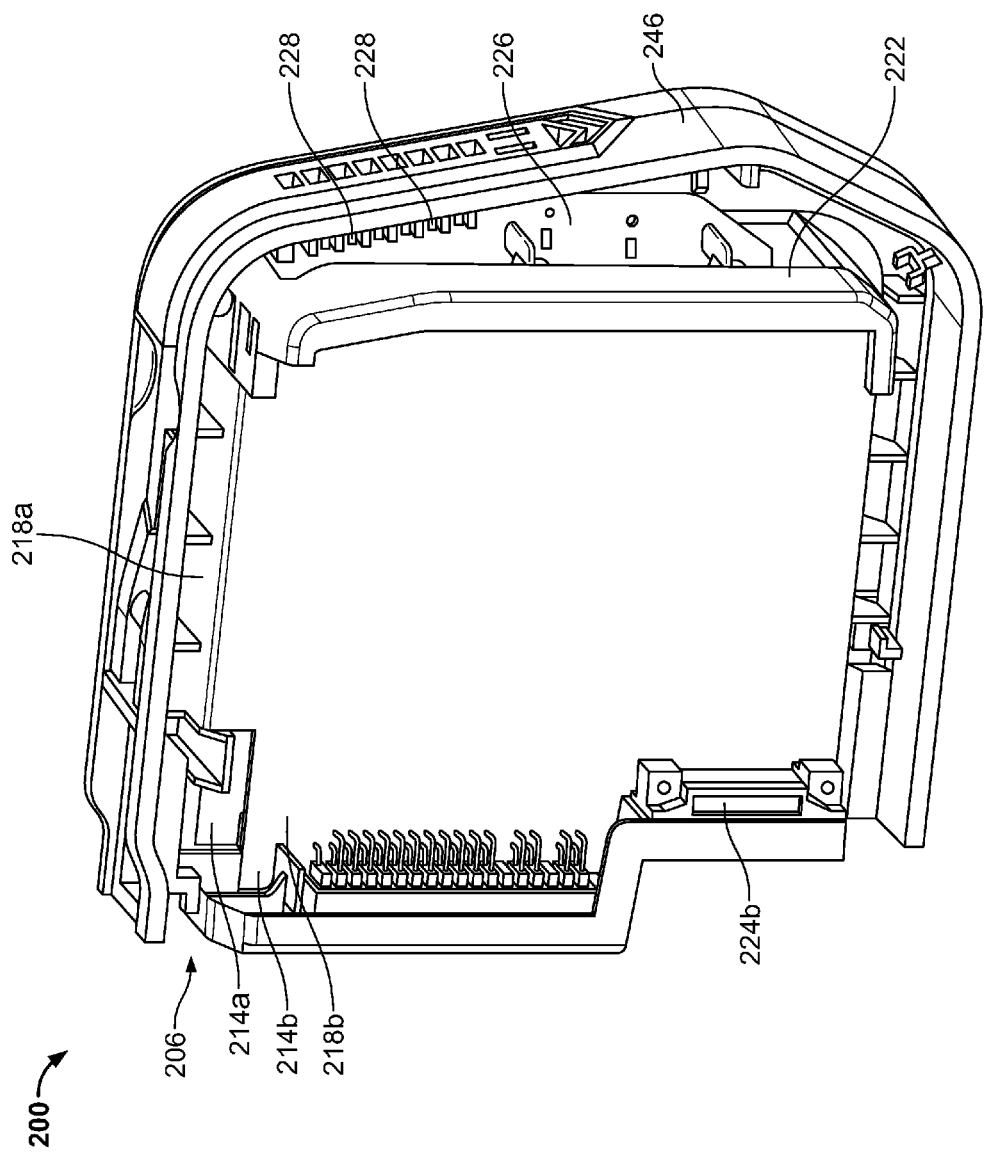
Figure 3:
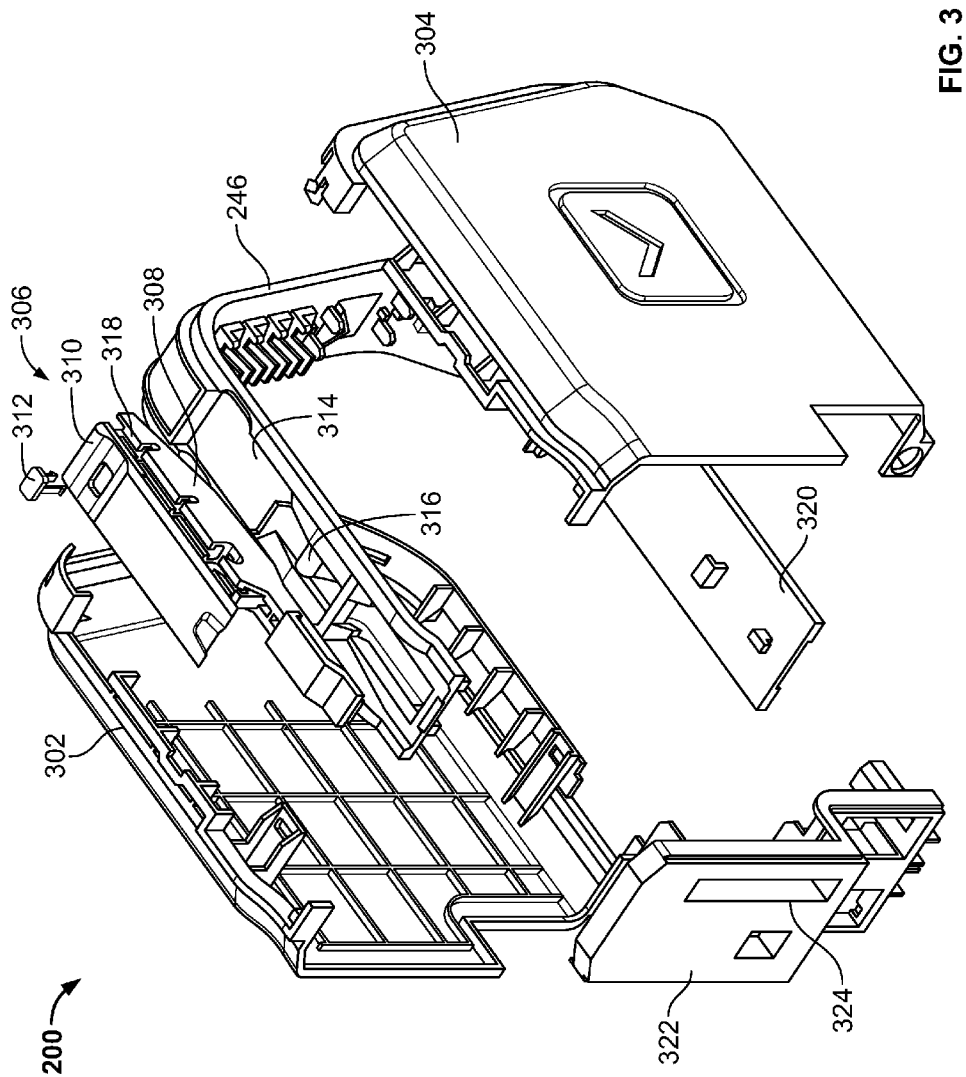
FIG. 3 illustrates an exploded view of the example enclosure shown in FIGS. 1A, 1B and 2A-2D.

FIG. 3 illustrates an exploded view of the example enclosure 200 of FIGS. 2A-2D. The housing 202 includes a first portion or panel 302 and a second portion or panel 304. In this example, a latch release mechanism 306 is coupled to the baffle 246 to enable the enclosure 200 to be coupled to and/or released from, for example, the base 104. The latch release mechanism 306 includes a rocking arm 308, a button portion 310, and a retaining clip 312. The baffle 246 includes a slot or opening 314 to receive the rocking arm 308, and the rocking arm 308 pivotally couples to the baffle 246 via a pivot 316. The button portion 310 couples (e.g., via snap fit) to the rocking arm 308 and is retained adjacent a first end 318 of the rocking arm 308 via the retaining pin 312. When the button portion 310 is depressed toward a surface 320 of the baffle 246, the first end 318 of the rocking arm 308 rotates about the pivot 316 to actuate or release, for example, the latching mechanism 106 of the base 104 (FIGS. 1A and 1B). Also, in this example, the rear portion 230 (FIG. 2B) of the enclosure 200 (FIG. 2B) is a third portion or panel 322. The third panel 322 couples to the first and second panels 302 and 304 and includes at least one opening 324 for at least one electrical connector to electrically couple the electronic circuit boards 214a-b (FIGS. 2C-D) to at least one other electronic device.

Figure 4A:
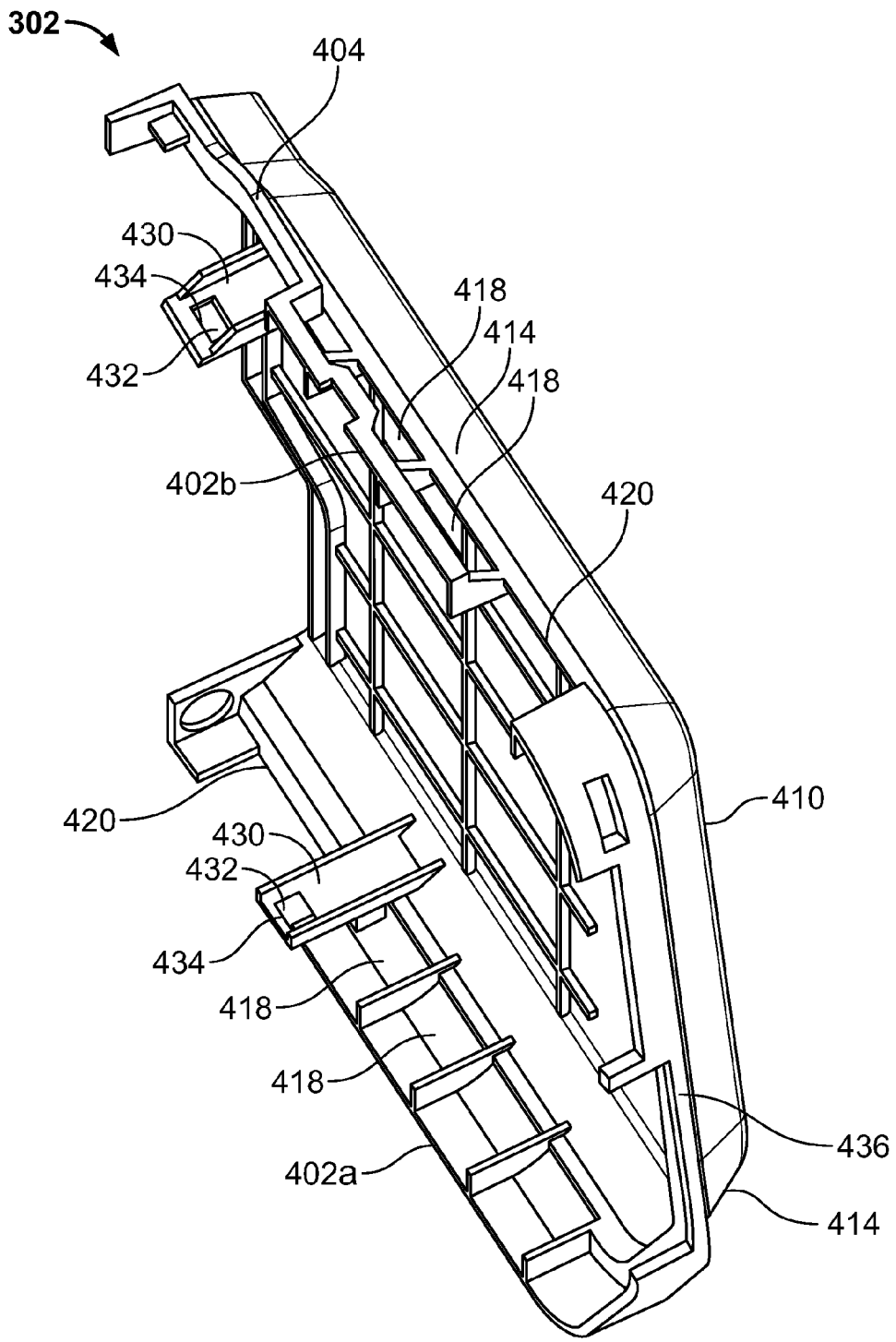
FIGS. 4A and 4B illustrate respective first and second portions of an example housing of the example enclosure of FIGS. 1A, 1B and 2A-2D.
Figure 4B:
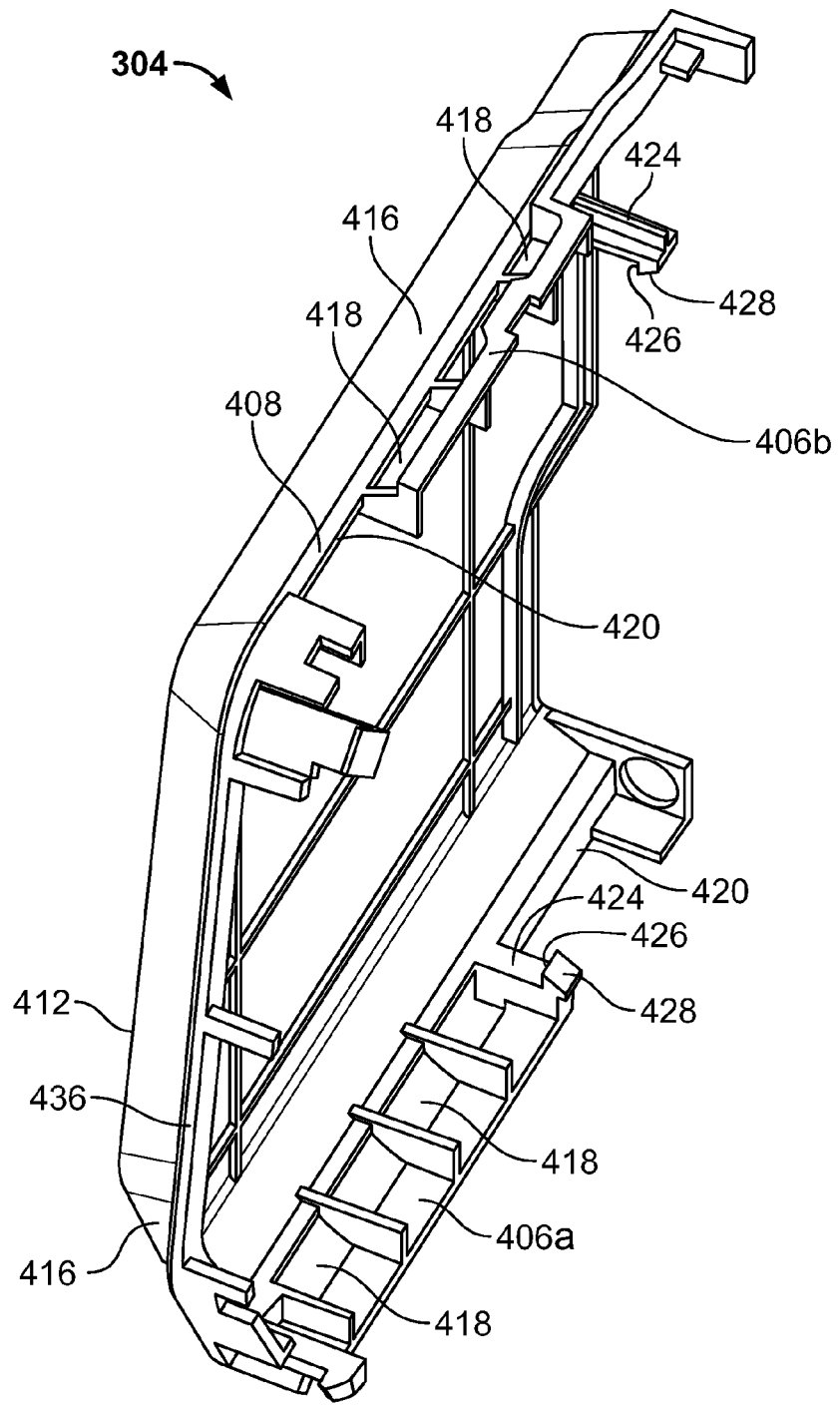

FIGS. 4A and 4B depict the first and second panels 302 and 304 of FIG. 3, respectively. Referring to FIGS. 4A and 4B, in this example, the first panel 302 includes grill or air vent portions 402a-b about a peripheral edge 404 of the first panel 302. The second panel 304 includes grill or air vent portions 406a-b about a peripheral edge 408 of the second panel 304. The grill portions 402a-b and 406a-b project inwardly relative to the respective first and second sides 410 and 412 via beveled edges 414 and 416. Additionally, the grill portions 402a-b and 406a-b protrude or extend from the respective peripheral edges 404 and 408 of the first and second panels 302 and 304. As shown, each of the grill portions 402a-b and 406a-b includes apertures 418 or slots 420.

Although not shown, in other examples, the first panel 302 may be configured to only include the grill portion 402a having at least one aperture 418 and the second panel 304 may be configured to only include the grill portion 406b having at least one aperture 418. In yet other examples, only the first panel 302 may include the grill portions 402a-b having apertures 418. In yet other examples, the first panel 302 and/or the second panel 304 may include additional grill portions having apertures 418 and/or slots 420 disposed along other portions of the respective peripheral edges 404 and 408. For example, additional grill portions may be provided along a front portion 436 of the edges 404 and 408.

In this example, the first and second panels 302 and 304 couple together via snap fit to define the housing 202. As shown, the second panel 304 includes flexible members 424 having edges 426 and tapered portions 428, and the first panel 302 includes receiving members 430 having apertures 432. When coupled together, the receiving members 430 receive respective ones of the flexible members 424 such that the edges 426 of the flexible members 424 engage respective surfaces 434 adjacent the apertures 432 to couple the first and second panels 302 and 304. In other examples, the first and second panels 302 and 304 may be coupled together via mechanical fasteners, chemical fasteners, and/or any other fastening mechanism(s). Each of the first and second panels 302 and 304 is made of a plastic material via, for example, injection molding or any other suitable manufacturing process(es). However, in other examples, the first and second panels 302 and 304 may be made of any other suitable material.

Figure 5A:
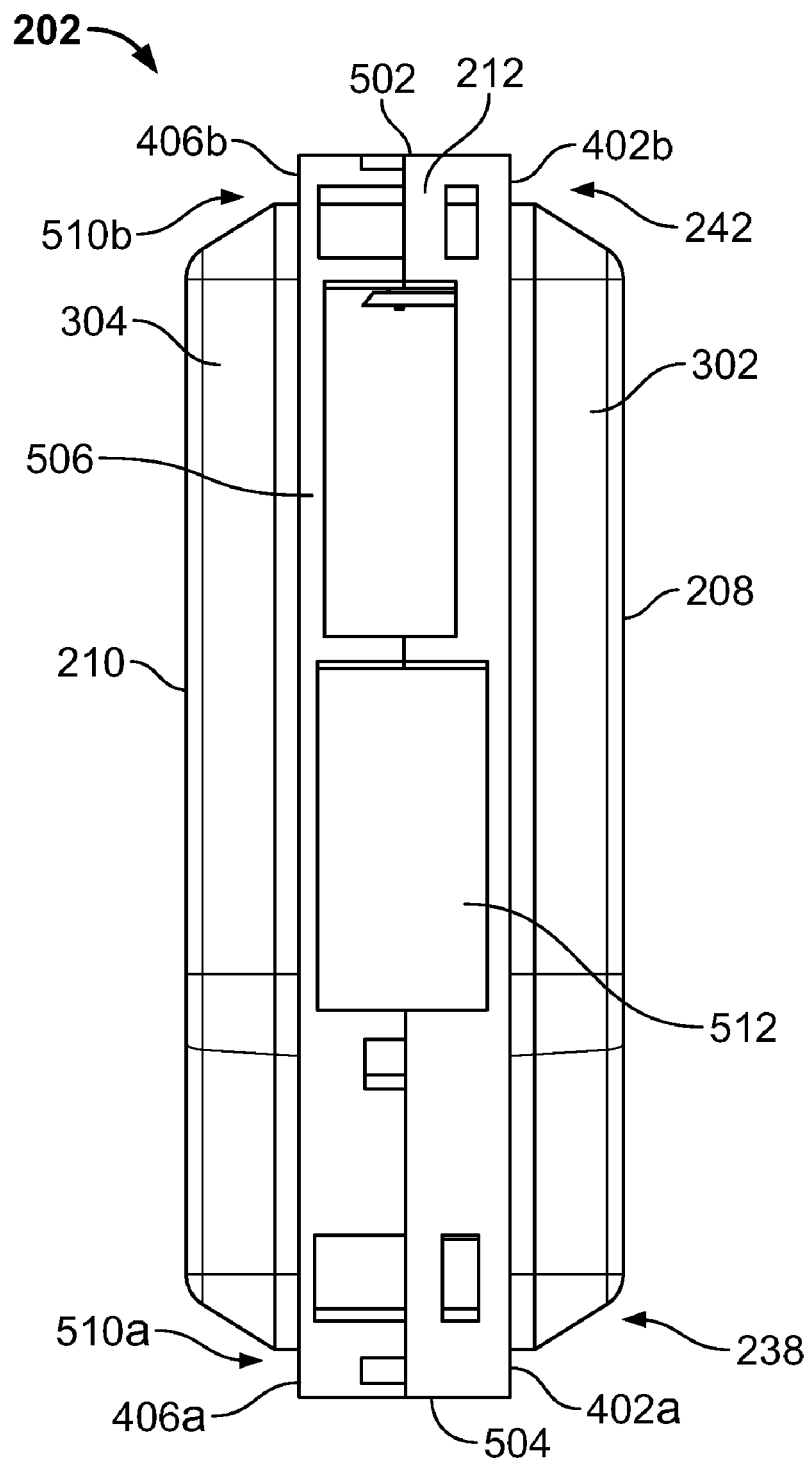
FIGS. 5A and 5B illustrate the example housing of FIGS. 1A, 1B and 2A-2D.
Figure 5B:
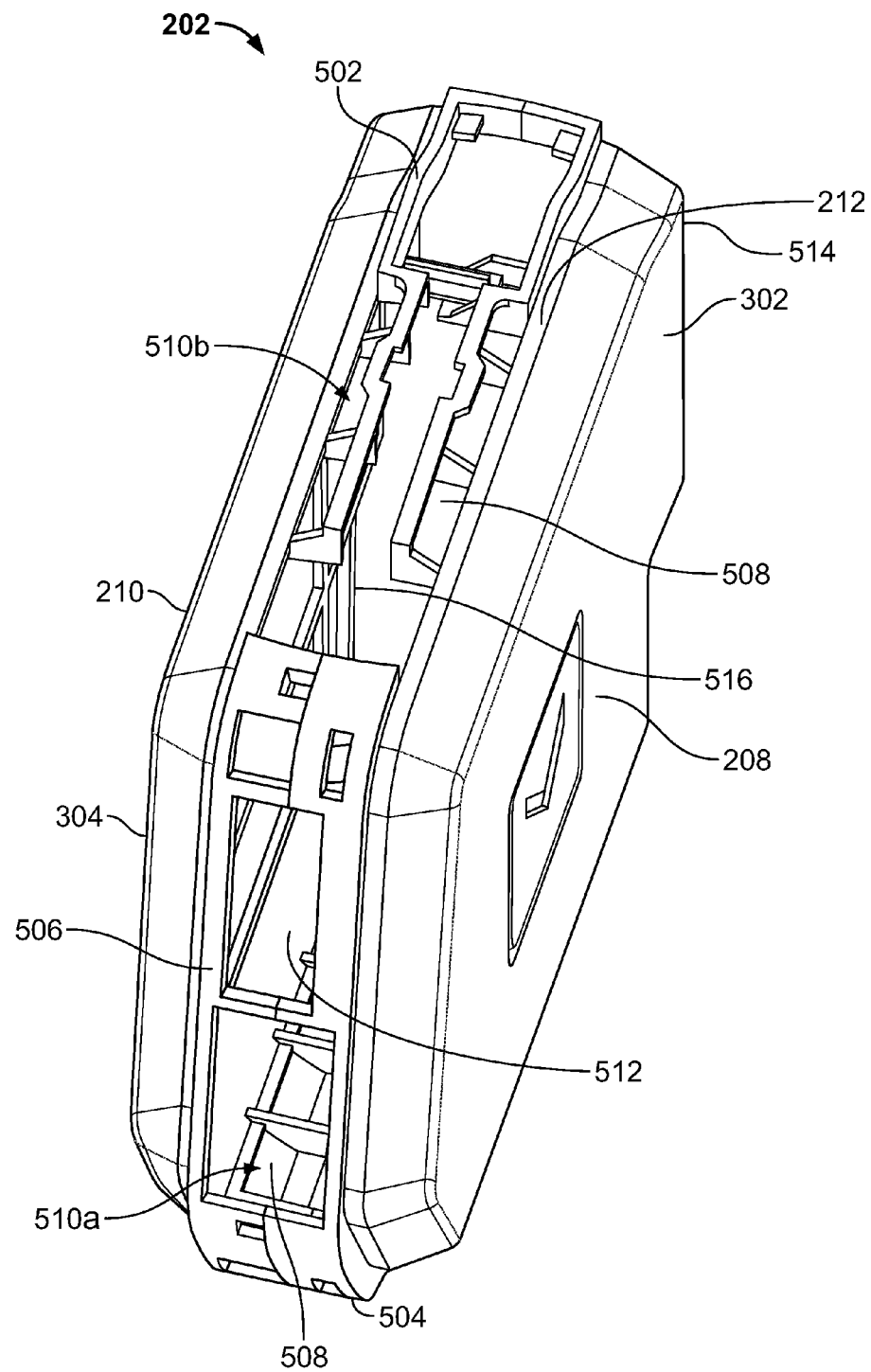

FIGS. 5A and 5B illustrate the example first and second panels 302 and 304 coupled together to define the housing 202. When coupled together, the first panel 302 defines the first face 208 of the housing 202 and the second panel 304 defines the second face 210 of the housing 202. Also, when the first and second panels 302 and 304 are coupled together, the grill portions 402a-b and 406a-b matably engage to define at least a part of the exterior peripheral surface 212 of the housing 202 separating the first and second faces 208 and 210. In this example, the exterior peripheral surface 212 includes a first or top face or side 502, a second or bottom face or side 504, and a third or front face or side 506.

When coupled together, the apertures 418 and/or the slots 420 (FIGS. 4A and 4B) of the first and second panels 302 and 304 provide openings 508 to define the first and second air vents 238 and 242. More specifically, the housing 202 includes a first plurality of openings 510a to be oriented in a first or downwardly facing direction and a second plurality of openings 510b to be oriented in a second or upwardly facing direction opposite the first plurality of openings 510a. The first plurality of openings 510a is distributed in first and second parallel rows and the second plurality of openings 510b is also distributed in third and fourth parallel rows. However, in other examples, the first plurality of openings 510a may be oriented in a different direction and/or configuration than the second plurality of openings 510b.

As shown, the first plurality of openings 510a is adjacent the bottom face 504 of the exterior peripheral surface 212 of the housing 202 and the second plurality of openings 510b is adjacent the top face 502 of the exterior peripheral surface 212. Further, the rows of openings making up each of the plurality of openings 510a and 510b are adjacent respective ones of the faces 208 and 210 of the housing 202. The first and second plurality of openings 510a and 510b provide the first and second air vents 238 and 242 to enable airflow to pass through the housing 202 to provide a passive cooling or natural convection ventilation to cool the electronic circuit board(s) 206 (FIGS. 2C and 2D) disposed within the housing 202. In other examples, the first plurality of openings 510*a* may include a greater number of openings 508 than the second plurality of openings 510*b*. In yet other examples, the openings 508 of the first plurality of openings 510*a* may be sized larger than the openings 508 of the second plurality of openings 510*b*, or the second plurality of openings 510*b* may be sized larger than the openings 508 of the first plurality of openings 510*a*.

The front face 506 of the exterior peripheral surface 212 also includes openings 512 to receive, for example, the light bar 226 (FIG. 2D). A rear face 514 of the housing 202 includes at least one opening 516 to receive at least one electrical connector to electrically couple the electronic circuit board(s) 206 (FIGS. 2C and 2D) to at least one other electronic device. As described above, in this example, the rear face 514 of the housing 202 receives the third panel 322 (FIG. 3), which includes the opening or port 324 to electrically couple the electronic circuit board(s) 206 to at least one other electronic device.

Figure 6:
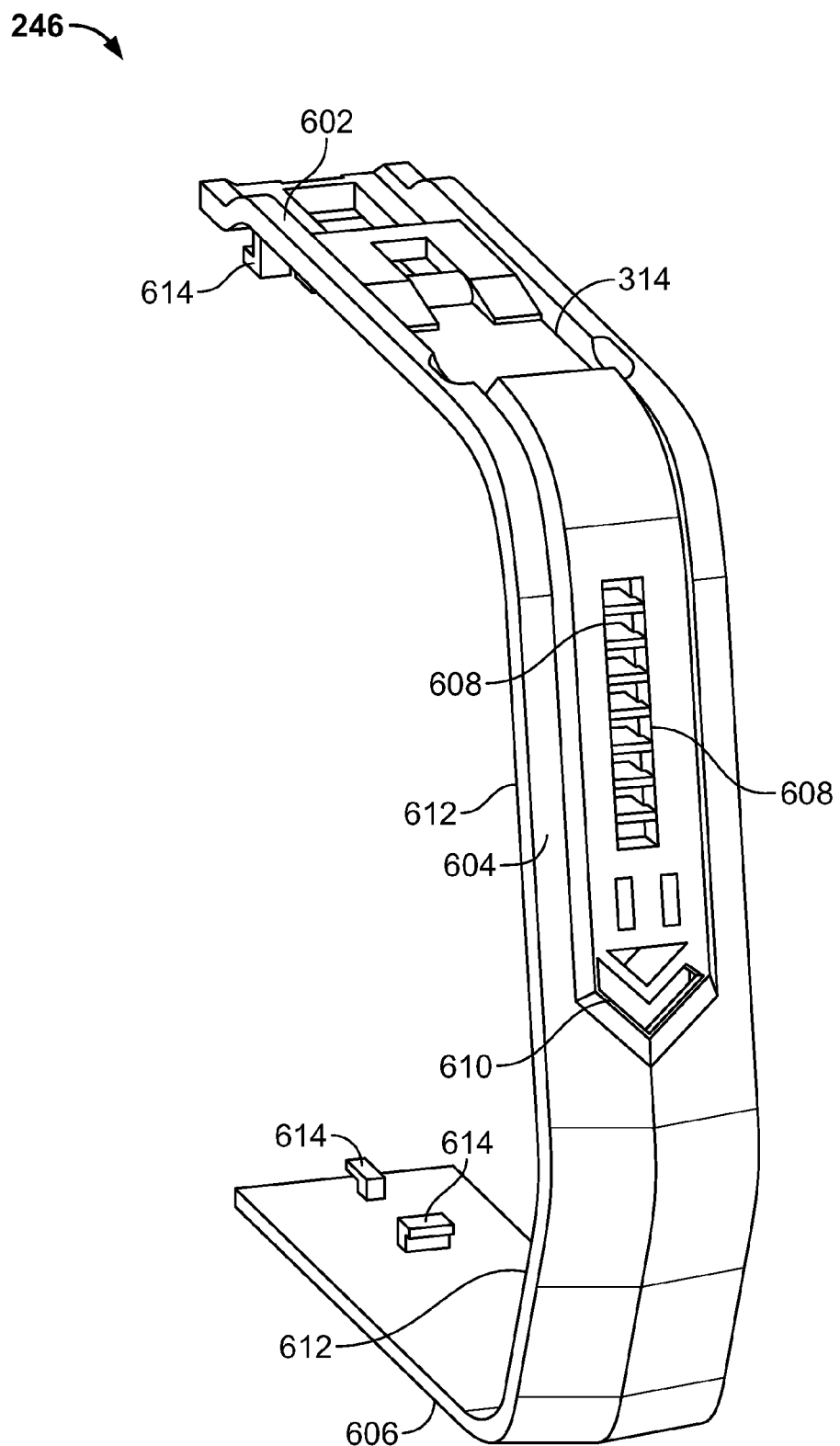
FIG. 6 illustrates an example baffle described herein of the example enclosure of FIGS. 1A, 1B and 2A-2D.

FIG. 6 illustrates the baffle 246. In this example, the baffle 246 is depicted as a unitary band or spine structure. However, in other examples, the baffle 246 may be separate pieces or structures that couple to the housing 202. In this example, the baffle 246 includes a top face 602, a front face 604 and a bottom face 606. As noted above, the top face 602 includes the slot 314 to receive the latch release mechanism 306 (FIG. 3). The baffle 246 also provides indicia associated with a characteristic of the electronic circuit board 206. For example, the front face 604 includes a plurality of openings 608 to display the status lights 228 of the light bar 226. Additionally, the front face 604 may include an opening 610 (e.g., a V-shaped opening) to receive an indicator light to indicate, for example, that electrical power is being supplied to the electronic module 100 (FIGS. 1A and 1B). The baffle 246 may also include a curved surface or profile 612 that may help channel the airflow through the housing 202 when the baffle 246 is coupled to the housing 202.

Additionally, the baffle 246 includes protruding members or clips 614 (e.g., hook-like members) that engage (e.g., interlock) with portions of the housing 202 to mechanically couple the baffle 246 to the housing 202 via snap-fit. In other examples, the baffle 246 may be coupled to the housing 202 via mechanical fasteners, chemical fasteners, and/or any other suitable fastener(s). In this example, the baffle 246 is made of a metallic material. However, in other examples, the baffle 246 may be made of a plastic material, a plastic-metal laminate, and/or any other suitable material.

Figure 7:
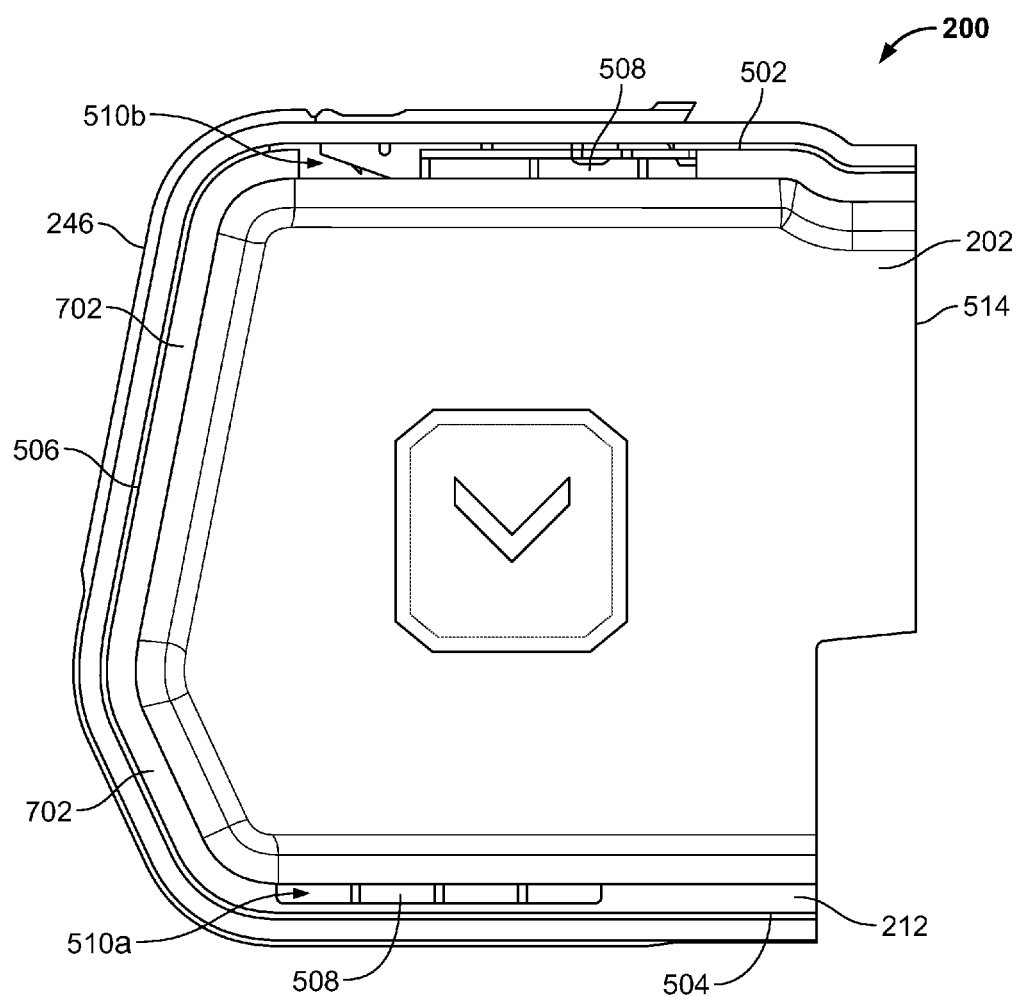
FIG. 7 is another illustration showing the example baffle of FIGS. 2A-2D, 3 and 6 coupled to the example housing of FIGS. 2A-2D, 3, 5A and 5B.

FIG. 7 illustrates a side view of the enclosure 200 showing the baffle 246 coupled to the housing 202. As shown, the housing 202 may include a curved portion or profile 702 between the first and second plurality of openings 510*a* and 510*b*. The curved portion 702 may facilitate or help channel the airflow between the first and second plurality of openings 510*a* and 510*b*. Also, when coupled to the housing 202, the baffle 246 substantially surrounds or wraps around a substantial portion of the exterior peripheral surface 212 of the housing 202. More specifically, the baffle 246 substantially surrounds the top face 502, the front face 506, and the bottom face 504 of the exterior peripheral surface 212 of the housing 202. Thus, in this example, the baffle 246 does not cover the opening or rear face 514 of the housing 202 when the baffle 246 is coupled to the housing 202. Additionally, the baffle 246 covers or at least partially visually obscures the plurality of openings 510*a* and 510*b* to provide a guard or shield, but does not inhibit airflow between the baffle 246 and the plurality of openings 510*a* and 510*b*.

Figure 8:
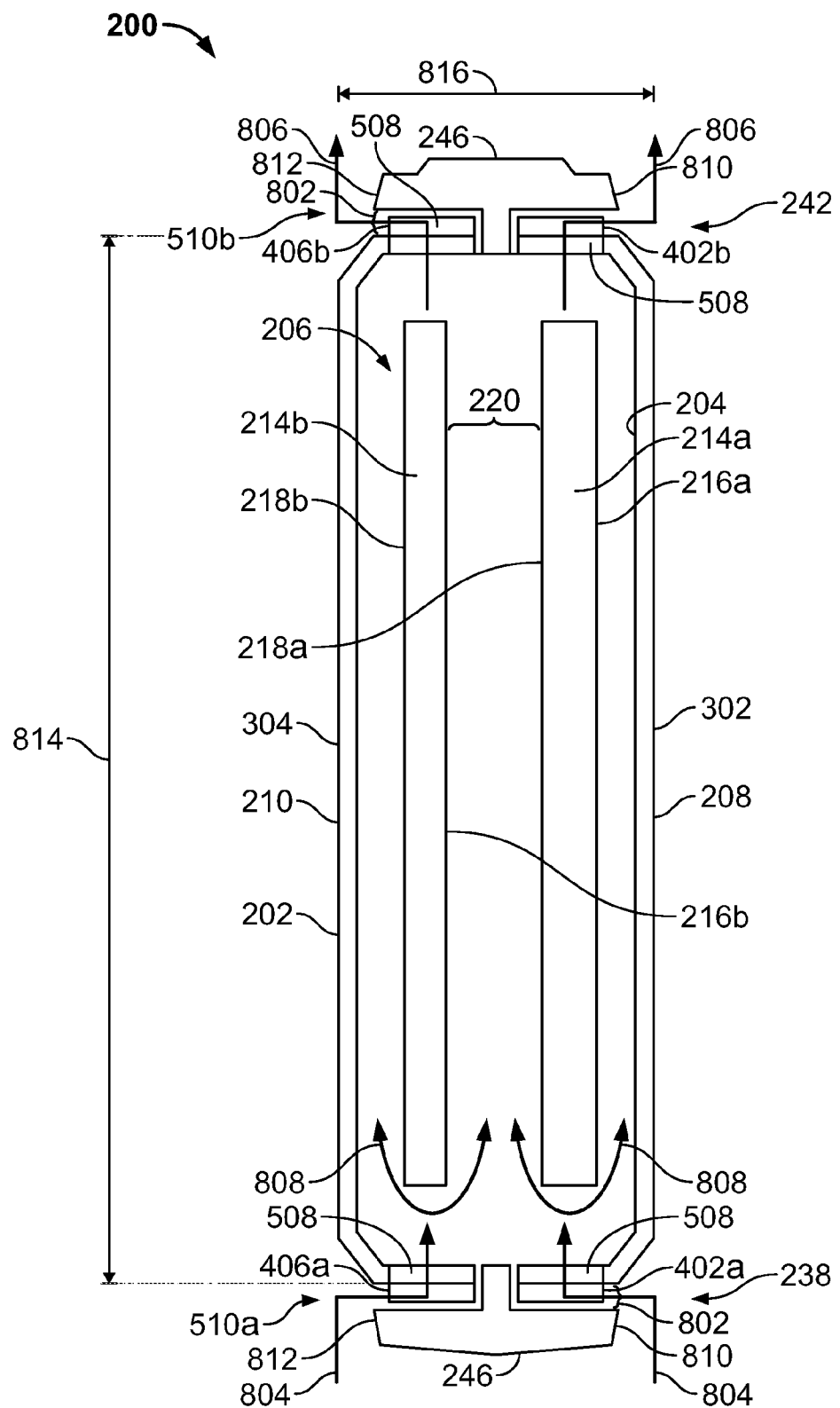
FIG. 8 is a schematic cross-sectional illustration showing the example baffle of FIGS. 2A-2D, 3 and 6 coupled to the example housing of FIGS. 2A-2D, 3, 5A and 5B.

FIG. 8 is a schematic cross-sectional illustration of the example baffle 246 coupled to the housing 202. As shown, the baffle 246 is mechanically coupled or captured between the first and second panels 302 and 304 when the first and second panels 302 and 304 are coupled together. When coupled to the housing 202, the baffle 246 is spaced away from the first plurality of openings 510*a* of the first air vent 238 and the second plurality of openings 510*b* of the second air vent 242 to define a gap 802 between the baffle 246 and the housing 202. The gap 802 enables airflow between the baffle 246 and the plurality of openings 510*a* and 510*b* as indicated by respective arrows 804 and 806.

The gap 802 between the baffle 246 and the openings 508 enables the baffle 246 to direct convection airflow into the first air vent 238 across all internal surfaces of the housing 202. More specifically, the baffle 246 directs airflow through the first air vent 238 adjacent the sides 216*a-b* and 218*a-b* (e.g., opposing faces) of the electronic circuit board(s) 206 as indicated by arrows 808 at the same time and out of the second air vent 242. Specifically, the first and second air vents 238 and 242 are spaced at opposite ends of the housing 202 to provide cross ventilation across the electronic circuit boards 214*a-b*.

As noted above, the gap 802 is dimensioned to enable the baffle 246 to direct or facilitate the direction of airflow across the first and second sides 216*a-b* and 218*a-b* of the electronic circuit boards 214*a-b*. Additionally, a first edge 810 of the baffle extends beyond the grill portions 402*a-b* of the first panel 302 adjacent the first face 208 of the housing 202 and a second edge 812 of the baffle 246 extends beyond the grill portions 406*a-b* of the second panel 304 adjacent the second face 210 of the housing 202. By recessing the grill portions 402*a-b* and 406*a-b*, the edges 810 and 812 extend beyond the recessed portions 402*a-b* and 406*a-b* so that the baffle 246 at least partially covers or shields and visually obscures the openings 508 of the housing 202 to prevent the ingress of debris, dirt, air-borne particles, and/or other contaminates or objects within the cavity 204 (e.g., the electronic circuit board 206) of the housing 202 via the openings 508. Also, when coupled to the housing 202, the baffle 246 helps channel the air flow through the housing 202 between the first air vent 238 and the second air vent 242.

In operation, electrical power is applied to the electronic circuit boards 214*a-b* disposed within the housing 202. The status lights 228 indicate whether electrical power is provided to the electronic circuit boards 214*a-b*. Also, the status lights 228 of the light bar 226 are visually displayed via the openings 608 of the baffle 246 when the baffle 246 is coupled to the housing 202. During operation, the electronic circuit boards 214*a-b* generate heat. The heat generated by the electronic circuit boards 214*a-b* increases the temperature of the air adjacent the electronic circuit boards 214*a-b* within the housing 202. In turn, the density of the warmer air is less when the temperature of the air increases relative to the surrounding air mass, causing the air to rise within the housing 202. As the air temperature within the housing 202 increases, air flows between the openings 508 of the first air vent 238 and the openings 508 of the second air vent 242.

More specifically, the baffle 246 directs the airflow through the first air vent 238 adjacent opposing faces of the electronic circuit boards 214*a-b* at the same time as indicated by arrows 808. In this manner, airflow is provided to substantially all sides (e.g., the first sides 216*a-b* and the second sides 218*a-b*) of the electronic circuit boards 214*a-b* to substantially prevent a hot spot condition that may otherwise occur if the airflow is not distributed (e.g., evenly) across all surfaces of the electronic circuit boards 214*a-b*. Also, the baffle 246 channels the air flow such that the warmer air exiting the second air vent 242 draws or pulls the cooler air from the first air vent 238 providing a chimney or stack effect. For example, a height 814 of the housing 202 may be sized significantly larger than a width 816 of the housing 202. In other words, the housing is configured (e.g., shaped and sized) and/or the baffle 246 is positioned to duct the warmer air rising toward the second air vent 242 more rapidly and efficiently (e.g., a passive cooling configuration).

Although not shown, in other examples, forced convection airflow may be provided toward or adjacent the first air vent 238 and/or the second air vent 242. Such forced convection may be provided via, for example, a cooling fan. In yet other examples, heat sinks may be disposed within the housing 202 to further improve dissipation of the heat from within the housing 202. In other words, the airflow provided through the housing 202 between the first and second air vents 238 and 242 may flow across heat sinks disposed within the housing 202 and/or the electronic circuit board 206 to further dissipate heat from within the housing 202.

Although certain example apparatus and articles of manufacture have been described herein, the scope of coverage of this patent is not limited thereto. On the contrary, this patent covers all apparatus and articles of manufacture fairly falling within the scope of the appended claims either literally or under the doctrine of equivalents.

What is claimed is:

1. An enclosure for holding an electronic circuit board, the enclosure comprising:
   a body having a first face, a second face opposite the first face, and an exterior peripheral surface separating the first and second faces, wherein the electronic circuit board is to be disposed between the first and second faces so that a first side of the electronic circuit board faces the first face and the second side of the electronic circuit board faces the second face, wherein a first portion of the exterior peripheral surface includes at least one opening for at least one electrical connector to electrically couple the electronic circuit board to another electronic device, wherein a second portion of the exterior peripheral surface includes a first air vent to be oriented in a downwardly facing direction, and wherein a third portion of the exterior peripheral surface includes a second air vent opposite the first air vent and which is to be oriented in an upwardly facing direction; and
   a baffle coupled to the body adjacent at least the second and third portions of the exterior peripheral surface, wherein the baffle is configured to direct airflow into the first air vent and out the second air vent, and wherein the baffle is to be coupled adjacent the second and third portions of the exterior peripheral surface to at least partially visually cover the air vents.

2. The enclosure of claim 1, wherein at least one of the first air vent or the second air vent comprises openings to enable the baffle to direct the airflow across the first side and the second side of the electronic circuit board.

3. The enclosure of claim 2, wherein the openings are distributed in a first row and a second row parallel to the first row, each of the rows being adjacent a respective one of the faces of the body.

4. The enclosure of claim 2, wherein the baffle is coupled to the body to define a gap between the baffle and the openings, wherein the gap is dimensioned to substantially visually cover the openings and to facilitate the direction of the airflow across the first and second sides of the electronic circuit board.

5. The enclosure of claim 1, wherein the body comprises a first portion and a second portion that is coupled to the first portion to form a cavity to hold the electronic circuit board.

6. The enclosure of claim 1, wherein the body is made of a plastic material and the baffle is made of a metal material.

7. The enclosure of claim 1, wherein the baffle comprises a unitary band or spine that covers a substantial portion of the exterior peripheral surface.

8. The enclosure of claim 7, wherein the baffle does not cover the first portion of the exterior peripheral surface.

9. The enclosure of claim 7, wherein the baffle is mechanically coupled to the body to be a structural member of the body.

10. The enclosure of claim 1, wherein the body comprises another air vent to direct airflow adjacent a respective one of the sides of the electronic circuit board.

11. The enclosure of claim 10, wherein the at least one of the first or second faces includes another baffle to at least partially cover the other air vent.

12. The enclosure of claim 11, wherein the other baffle provides indicia associated with a characteristic of the electronic circuit board.

13. An enclosure for holding an electronic circuit board, the enclosure comprising:
    a housing having a first portion coupled to a second portion to form a cavity to hold the electronic circuit board, wherein each of the first and second portions comprises openings to direct convection airflow across opposing faces of the electronic circuit board at the same time; and
    a baffle coupled to the housing to substantially visually obscure the openings and to define a gap between the housing and the baffle to direct the convection airflow across the opposing faces of the electronic circuit board.

14. The enclosure of claim 13, wherein the baffle comprises a unitary band or spine that wraps around at least a portion of a peripheral exterior surface of the housing between opposing faces of the housing.

15. The enclosure of claim 13, wherein the baffle is made of metal and the housing is made of plastic.

16. The enclosure of claim 13, wherein the baffle is coupled to the housing to be a structural member of the housing.

17. An enclosure for holding an electronic circuit board, the enclosure comprising:
    a housing having a cavity to hold the electronic circuit board, wherein the housing has first openings on a first side of the housing to be oriented in a downwardly facing direction and second openings on a second side of the housing to be oriented in an upwardly facing direction; and
    a baffle coupled to the housing and spaced from the openings to visually obscure the openings and to direct airflow into the first openings, adjacent opposing faces of the electronic circuit board at the same time, and out the second openings.

18. The enclosure of claim 17, wherein the baffle comprises a unitary band or spine that wraps around at least a portion of a peripheral exterior surface of the housing between opposing faces of the housing.

19. The enclosure of claim 17, wherein the baffle is made of metal and the housing is made of plastic.

20. The enclosure of claim 17, wherein the baffle is coupled to the housing to be a structural member of the housing.

* * * * *